(12) United States Patent
Xu et al.

(10) Patent No.: US 11,634,830 B2
(45) Date of Patent: Apr. 25, 2023

(54) ELECTROCHEMICAL DEPOSITIONS OF NANOTWIN COPPER MATERIALS

(71) Applicant: Applied Materials, Inc., Santa Clara, CA (US)

(72) Inventors: Jing Xu, Kalispell, MT (US); John L. Klocke, Kalispell, MT (US); Marvin L. Bernt, Kalispell, MT (US); Eric J. Bergman, Kalispell, MT (US); Kwan Wook Roh, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/411,305

(22) Filed: Aug. 25, 2021

(65) Prior Publication Data
US 2023/0068074 A1  Mar. 2, 2023

(51) Int. Cl.
*C25D 3/38* (2006.01)
*C25D 5/02* (2006.01)
(Continued)

(52) U.S. Cl.
CPC ............... *C25D 3/38* (2013.01); *C23C 14/18* (2013.01); *C23C 16/45525* (2013.01);
(Continued)

(58) Field of Classification Search
None
See application file for complete search history.

(56) References Cited

U.S. PATENT DOCUMENTS

| 2002/0117399 A1* | 8/2002 | Chen ............... C23C 16/45525 428/209 |
| 2014/0103501 A1 | 4/2014 | Chen et al. |
| 2021/0172086 A1 | 6/2021 | Bai et al. |

FOREIGN PATENT DOCUMENTS

| CN | 106298634 A | 1/2017 |
| EP | 1029948 A2 * | 8/2000 ............. C23C 28/00 |

(Continued)

OTHER PUBLICATIONS

Cheng et al. J. Phys. D: Appl. Phys. 49 (2016) 40LT01 (8pp) (Year: 2016).*

(Continued)

*Primary Examiner* — Wojciech Haske
(74) *Attorney, Agent, or Firm* — Kilpatrick Townsend & Stockton LLP

(57) ABSTRACT

Exemplary methods of electroplating include contacting a patterned substrate with a plating bath in an electroplating chamber, where the pattern substrate includes at least one opening having a bottom surface and one or more sidewall surfaces. The methods may further include forming a nanotwin-containing metal material in the at least one opening. The metal material may be formed by two or more cycles that include delivering a forward current from a power supply through the plating bath of the electroplating chamber for a first period of time, plating a first amount of the metal on the bottom surface of the opening on the patterned substrate and a second amount of the metal on the sidewall surfaces of the opening, and delivering a reverse current from the power supply through the plating bath of the electroplating chamber to remove some of the metal plated in the opening on the patterned substrate.

17 Claims, 4 Drawing Sheets

(51) Int. Cl.
  *C25D 5/54* (2006.01)
  *H01L 21/288* (2006.01)
  *C23C 14/18* (2006.01)
  *H01L 21/28* (2006.01)
  *H01L 21/768* (2006.01)
  *C23C 16/455* (2006.01)

(52) U.S. Cl.
  CPC ............. *C25D 5/02* (2013.01); *C25D 5/54* (2013.01); *H01L 21/2885* (2013.01); *H01L 21/28114* (2013.01); *H01L 21/76873* (2013.01)

(56) References Cited

FOREIGN PATENT DOCUMENTS

| | | |
|---|---|---|
| KR | 20120097344 A | 9/2012 |
| WO | 2020092244 A1 | 5/2020 |

OTHER PUBLICATIONS

International Search Report and Written Opinion dated Dec. 14, 2022 in International Patent Application No. PCT/US2022/041124, 12 pages.

* cited by examiner

ELECTROCHEMICAL DEPOSITIONS OF NANOTWIN COPPER MATERIALS

TECHNICAL FIELD

The present technology relates to electrochemical deposition operations in semiconductor processing. More specifically, the present technology relates to systems and methods that perform electrochemical depositions of nanotwin-copper-containing materials on semiconductor structures and in semiconductor packaging.

BACKGROUND

Integrated circuits are made possible by processes that produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

Electroplating is performed in an electroplating chamber with the target side of the wafer in a bath of liquid electrolyte, and with electrical contacts on a contact ring touching a conductive layer, such as a seed layer, on a substrate material. Electrical current is passed through the electrolyte and the conductive layer from a power supply. Metal ions in the electrolyte plate out onto the substrate material, creating a metal layer on the substrate material. When the substrate material has patterned, non-planar features defined across the surface, the metal ions in the electrolyte may not deposit at the same rate at all points on the non-planar features. These variations can challenge electroplating operations and create deposited materials that include voids and non-uniform thicknesses, among other defects.

Thus, there is a need for improved systems and methods that can be used to produce high-quality devices and structures. These and other needs are addressed by the present technology.

SUMMARY

Embodiments of the present technology include electroplating methods that include contacting a patterned substrate with a plating bath in an electroplating chamber. The patterned substrate may include at least one opening having a bottom surface and one or more sidewall surfaces. The methods may further include forming a metal material in the at least one opening, where the metal material is formed by two or more cycles that include delivering a forward current from a power supply through the plating bath of the electroplating chamber for a first period of time. The forward current is a pulsed current characterized by a duty cycle of less than or about 50%. The cycles also include plating a first amount of the metal ion on the bottom surface of the opening on the patterned substrate and a second amount of the metal on the sidewall surfaces of the opening. At least a portion of the first amount of the metal is characterized by a nanotwin crystal structure. The cycles further include delivering a reverse current from the power supply through the plating bath of the electroplating chamber to remove some of the metal plated in the opening on the patterned substrate. The reverse current removes a greater portion of the second amount of the metal plated on the sidewall surfaces of the opening than the first amount of the metal plated on the bottom surface.

In additional embodiments, the forward current delivered by the power supply is characterized by an on-period of greater than or about 10 milliseconds. In further embodiments, the forward current is characterized by an average current density of greater than or about 3 mA/cm$^2$. In still further embodiments, the reverse current is another pulsed current characterized by an on-period of less than or about 10 milliseconds. In yet additional embodiments, the reverse current is delivered at least 1 millisecond after the pulsed forward current. In more embodiments, the metal material formed in the at least one opening includes nanotwin copper. In still more embodiments, the methods may include annealing the metal material formed in the at least one opening to increase the amount of the metal characterized by the nanotwin crystal structure. In yet further embodiments, the sidewall surfaces include a barrier layer that reduces a deposition rate of the second amount of the metal plated on the sidewall surfaces.

Embodiments of the present technology also include electroplating methods that include providing a patterned substrate that includes at least one opening having a bottom surface and one or more sidewall surfaces. The methods further include forming a barrier layer on the bottom surface and sidewall surfaces of the opening. The barrier layer is removed from the bottom surface of the opening and remains, at least in part, on the sidewall surfaces. The methods still further include plating a metal in the opening. The plating includes one or more cycles that include plating a first amount of metal on the bottom surface of the opening at a first deposition rate and a second amount of the metal on the sidewall surfaces at a second deposition rate that is less than or about 0.5 times as fast as the first deposition rate. At least a portion of the first amount of the metal is characterized by a nanotwin crystal structure.

In additional embodiments, the barrier layer includes a non-metal dielectric material. In further embodiments, the metal formed on the bottom surface of the opening includes nanotwin copper. In still further embodiments, the one or more cycles of plating also include delivering a forward current from a power supply through a plating bath of an electroplating chamber for a first period of time to plate the first amount of the metal on the bottom surface of the opening and the second amount of the metal on the sidewall surfaces of the opening. The one or more cycles of plating further include delivering a reverse current from the power supply through the plating bath of the electroplating chamber to remove some of the metal plated in the opening on the patterned substrate. The reverse current removes a greater portion of the second amount of the metal plated on the sidewall surfaces of the opening than the first amount of the metal plated on the bottom surface. In yet additional embodiments, the methods also include removing at least a portion of one or more metal oxides from the metal plated in the opening of the patterned substrate. In more embodiments, the methods further include annealing the metal plated in the opening to increase the amount of the metal characterized by the nanotwin crystal structure.

Embodiments of the present technology further include integrated circuit device structures. The structures include a patterned substrate that includes at least one opening, where the opening includes a bottom surface and one or more sidewall surfaces. The structures also include a metal-containing material that fills the opening, where at least a top portion of the metal-containing material is characterized by a nanotwin crystal structure.

In additional embodiments, the metal-containing material includes nanotwin copper. In further embodiments, the sidewall surfaces of the opening further include a barrier layer while the bottom surface is free of the barrier layer. In still further embodiments, the barrier layer is a monolayer of an organic molecule. In yet additional embodiments, the opening is characterized by an aspect ratio greater than or about 1:1. In more embodiments, a bottom portion of the metal-containing material in contact with the bottom surface of the opening is characterized by a polycrystalline structure.

Embodiments of the present technology permit the electroplating of nanotwin metals, such a nanotwin copper, in openings on patterned substrates. These embodiments form metal lines, vias, pillars, and other metal-containing components of an integrated circuit device, where bonding surfaces on the components include metal with a nanotwin crystal structure. In many instances, metals with a nanotwin crystal structure are less susceptible to oxide formation and more easily bond to similar metal surfaces at lower bonding temperatures and pressures. Additionally, embodiments of the present technology may be performed in a plating chamber in which nanotwin-metal-containing lines and columns are formed at high throughput into openings on a patterned substrate. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
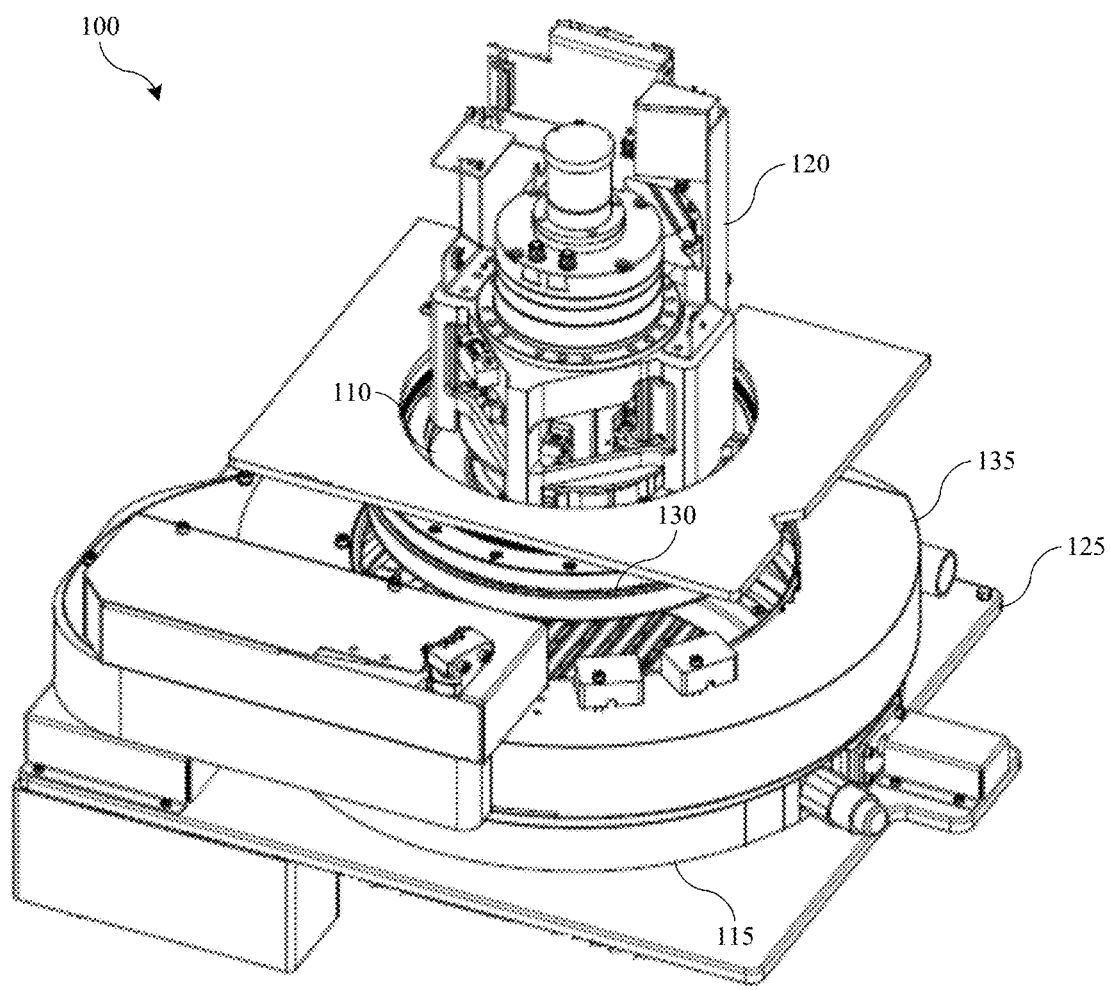
FIG. 1 shows a schematic perspective view of an electroplating system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Many types of electronic devices that use semiconductor-based integrated circuits have progressed from single chip (i.e., die) packages, which are electronically interconnected through a circuit board, to multiple chips that are stacked or otherwise arrayed in a single package. These multiple-die packages can include dies for memory, logic, micro-electro-mechanical-systems (MEMS), and sensors, among other functions, and may include system-on-chip (SoC) and system-in-package (SiP) packages. As these multiple-chip packages add more chips that are further miniaturizing, the density of the electrical interconnections (i.e., the interconnect density) between them increases. This has caused the size of those interconnections to decrease. These sizes, commonly measured as the pitch of an electrically-conductive line or via that makes an interconnection between input/output pads on adjacent semiconductor dies, have decreased from several hundred micrometers to 10 μm or less.

The decrease in the pitch size of the interconnects has changed how the connections are formed. For many kinds of increasingly miniaturized multi-die packages, a conventional solder bump, measuring hundreds of microns in diameter, is too large to form high-density interconnects with pitch sizes of 50 μm or less. In many instances, these high-density interconnects eliminate solder bumps and form a direct metal-to-metal connection between opposite facing lines, vias, and pads of the interconnect.

In most conventional, high-interconnect-density integrated circuit devices, the direct metal-to-metal connections are made with polycrystalline copper whose grains are in random orientations. Unfortunately, as the pitch sizes of copper lines, vias, and pillars continue to decrease, the limitations of polycrystalline copper become more apparent. In many cases, the oxidation and diffusivity characteristics, among other characteristics, of polycrystalline copper require copper-copper bonding to be done at high temperatures and pressures. The bonding conditions can cause more cracks and other defects in the smaller and thinner copper lines around the bonding site. The number of defects is further compounded by the increased density of bonding sites in the high-interconnect-density integrated circuits. As interconnect pitch sizes and other dimensions continue to decrease and bonding site density continues to increase, the problems with high-temperature, high-pressure bonding of polycrystalline copper surfaces continue to grow.

Embodiments of the present technology address the problems with bonding polycrystalline copper in high-interconnect-density integrated circuit devices by replacing the polycrystalline copper with nanotwin copper (NTCu), which has a <1,1,1> crystallographic orientation. In additional embodiments, a significant percentage of the NTCu grains at a bonding surface of the metal are oriented in the same <1,1,1> direction. NTCu is significantly less prone to oxidation and the formation of copper oxide than polycrystalline copper. NTCu is also characterized by diffusivity rates that are normally 1000 to 10,000 times higher than polycrystalline copper. Due to these and other characteristics, bonding temperatures and pressures for NTCu are significantly lower than polycrystalline copper. Unfortunately, NTCu is not as stable as other crystal phases of copper, and it has proven challenging to electroplate the openings in patterned substrates with NTCu that does not destabilize to form one or more kinds of polycrystalline copper.

Embodiments of the present technology address the instability of NTCu deposited by electroplating through a better understanding of how NTCu is formed during an electrodeposition. Electroplated copper can be formed with a nanotwin crystal phase when deposited up from a bottom surface of the opening, but does form with little or no nanotwin phase when plated on the sidewall surfaces of the opening. Thus, electroplating techniques that favor the bottom-up deposition of copper from the bottom surface over the sidewall surfaces of an opening can create a contact surface of the deposited copper at the top of the opening that includes significant amounts of NTCu grains oriented in the direction of the <1,1,1> crystal orientation. In embodiments, these techniques include one or more electroplating conditions that suppress copper plating on the sidewall surfaces of the opening and increase copper plating on the bottom surface. They also include post-plating conditioning of the as-deposited NTCu-containing material to further increase and stabilize it.

FIG. 1 shows a schematic perspective view of an electroplating system 100 that can perform NTCu electroplating methods according to embodiments of the present technology. Electroplating system 100 illustrates an exemplary electroplating system, including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 115, or otherwise position the head within the system, including tilting operations. The head and bowl may be attached to a deck plate 125 or other structure that may be part of a larger system incorporating multiple electroplating systems 100, and which may share electrolyte and other materials. A rotor may allow a substrate clamped to the head to be rotated within the bowl or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates an electroplating system 100 that may include components to be cleaned directly on the platform. In embodiments, the electroplating system 100 further includes an in situ rinse system 135 for component cleaning. In additional embodiments (not shown) an electroplating system may be configured with a platform on which the head may be moved to an additional module where a seal or other component cleaning is performed.

Figure 2:
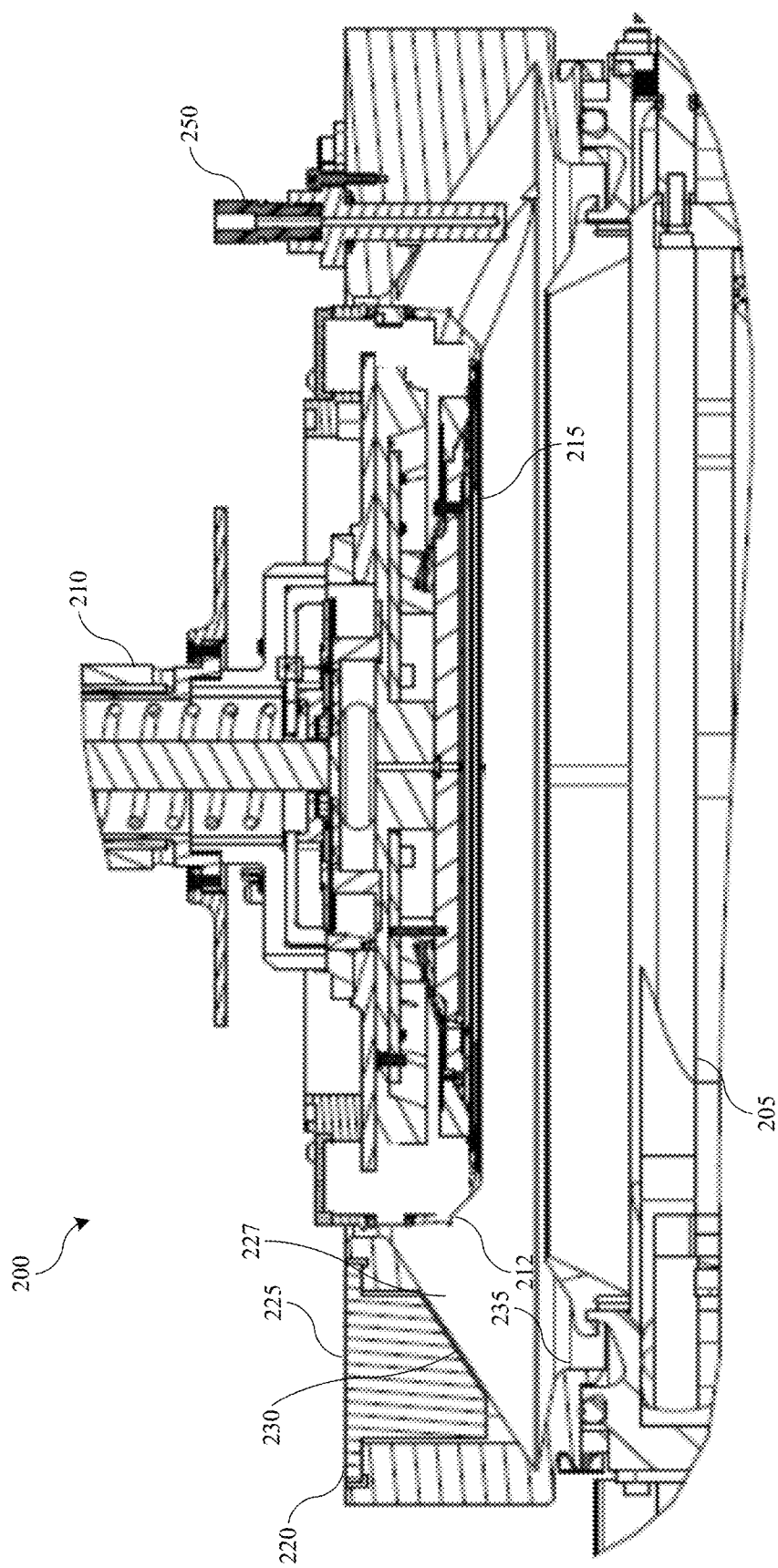
FIG. 2 shows a partial cross-sectional view of an electroplating system according to some embodiments of the present technology.

FIG. 2 shows a partial cross-sectional view of an electroplating chamber that includes an electroplating apparatus 200 according to some embodiments of the present technology. The electroplating apparatus 200 may be incorporated with an electroplating system, including system 100 described above. As illustrated in FIG. 2, a plating bath 205 of an electroplating system is shown along with a head 210 having a substrate 215 coupled with the head. In the embodiment shown, a substrate is coupled with a seal 212 incorporated on the head 210. A rinsing frame 220 may be coupled above the plating bath vessel 205 and may be configured to receive the head 210 into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may include interior sidewalls 230 characterized by a sloping profile. As described above, rinse fluid slung off a substrate may contact the sidewalls 230 and may be received in a plenum 235 extending about the rim for collection of the rinse fluid from the electroplating apparatus 200.

In embodiments, electroplating apparatus 200 may additionally include one or more cleaning components. The cleaning components may include one or more nozzles used to deliver fluids to or towards the substrate 215 or the head 210. FIG. 2 illustrates one of a variety of embodiments in which improved rinse assemblies may be used to protect the bath and substrate during rinsing operations. In additional embodiments, a side clean nozzle 250 may extend through the rim 225 of the rinsing frame 220 and be directed to rinse seal 212, along with aspects of substrate 215.

Figure 3:
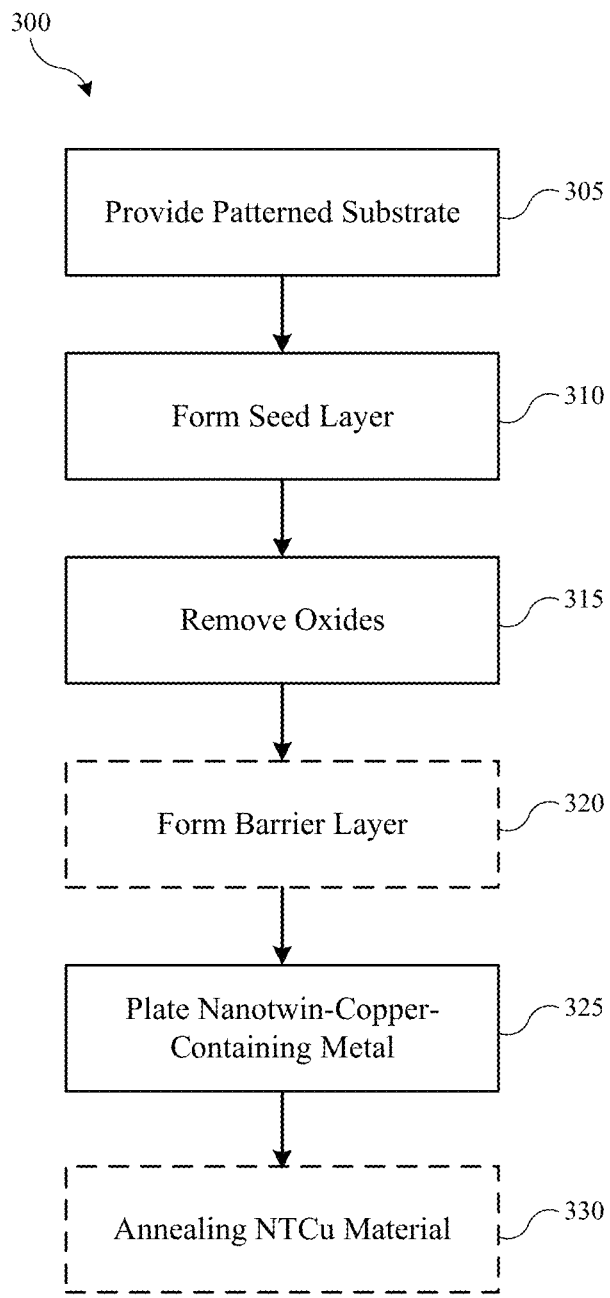
FIG. 3 shows exemplary operations in a method of electroplating according to some embodiments of the present technology.

Embodiments of the above-described systems and chambers may be used to perform embodiments of the present NTCu electroplating methods. FIG. 3 shows exemplary operations in a method 300 of electroplating a NTCu-containing material according to embodiments of the present technology. The method 300 may also include one or more operations prior to the initiation of the method, including front-end processing, deposition, gate formation, etching, polishing, cleaning, or any other operations that may be performed prior to the described operations. The method may further include a number of optional operations, which may or may not be specifically associated with some embodiments of methods according to the present technology. For example, many of the operations are described in order to provide a broader scope of the processes performed but are not critical to the technology or may be performed by alternative methodology, as will be discussed further below. Method 300 may describe operations shown schematically in FIGS. 4A-4B, the illustrations of which will be described in conjunction with the operations of method 300. It is to be understood that the figures illustrate only partial schematic views, and a substrate may contain any number of additional materials and features having a variety of characteristics and aspects, as illustrated in the figures. Embodiments of method 300 may or may not involve optional operations to develop the semiconductor structure to a particular fabrication operation.

Figure 4A:
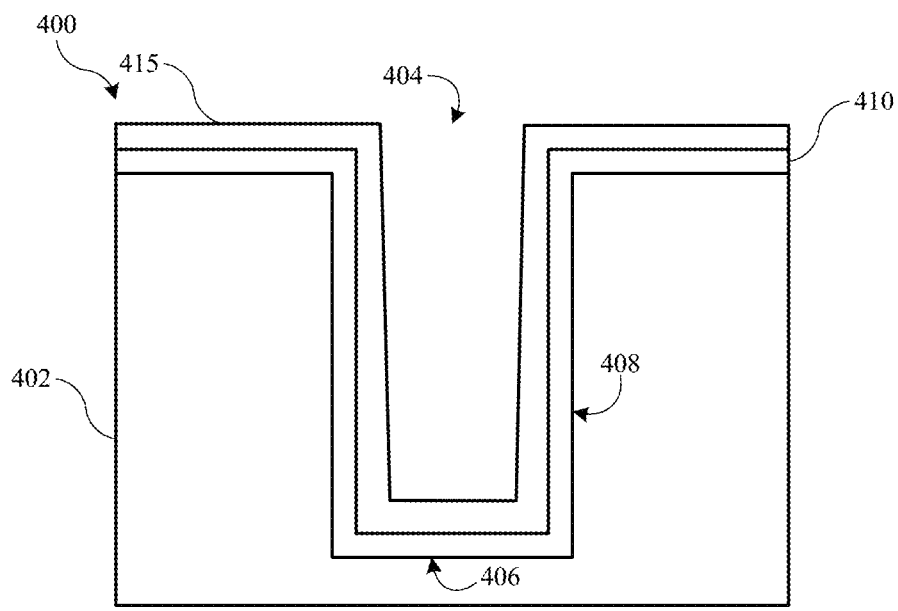
FIGS. 4A-4B show schematic cross-sectional views of a patterned substrate undergoing a plating of nanotwin-copper-containing material according to some embodiments of the present technology.

Embodiments of method 300 include providing a patterned substrate 400 in operation 305. FIG. 4A shows a portion of a patterned substrate 400 that may be included in, for example, an intermediate packaging region of a single-die or multi-die (e.g., 3D-IC) integrated circuit package. The portion of patterned substrate 400 may include at least one opening 404. In embodiments, the opening 404 may include a bottom surface 406 and one or more sidewall surfaces 408. In further embodiments, the opening 404 may be a trench that shapes part of an NTCu-containing conductive line, such as a redistribution line in an intermediate packaging region. In additional embodiments, the opening 404 may be a via that shapes an NTCu-containing conductive via or pillar. In still further embodiments, the opening 404 may include one or more of a recess, a step, or an isolation structure, among other kinds of structures.

In embodiments, the patterned substrate 400 may include a dielectric layer 402 into which the opening 404 may be formed. In the embodiment shown in FIG. 4A, the opening 404 terminates in the dielectric layer 402 to leave the bottom surface 406 of the opening made of an exposed surface of the dielectric layer 402. These openings may include trenches that shape part of an NTCu-containing, electrically conductive line, such as a redistribution line. In additional embodiments (not shown), one or more openings may extend through the dielectric layer and terminate at an underlying conductive layer, such as a pad layer. In these embodiments, the underlying layer forms the bottom surface of the opening instead of the dielectric layer. These openings may include columnar vias and pillars that electrically connect metal lines and layers in vertically separated planes.

In embodiments, the opening 404 may be characterized by a pitch that is less than or about 100 µm, less than or about 75 µm, less than or about 50 µm, less than or about 40 µm, less than or about 30 µm, less than or about 20 µm, less than or about 10 µm, less than or about 5 µm, less than or about 4 µm, less than or about 3 µm, less than or about 2 µm, less than or about 1 µm, or less. In further embodiments, the opening 404 may be characterized by a height-to-width ratio (i.e., an aspect ratio) that is greater than or about 0.25:1, greater than or about 0.5:1, greater than or about 0.75:1, greater than or about 1:1, greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more.

In additional embodiments, the patterned substrate 400 may be formed by depositing and patterning a photoresist material on at least one layer of dielectric material and etching the at least one opening into the layer of dielectric material through the patterned photoresist. In further embodiments, the patterned substrate 400 may be formed in at least one layer of semiconductor material. In more embodiments, the at least one layer of dielectric material may include silicon oxide, silicon nitride, silicon-carbon-nitride, or an organic polymer (e.g., a benzocycloalkane), among other dielectric materials. In still more embodiments, the at least one layer of semiconductor material may include silicon, germanium, or gallium arsenide, among other semiconductor materials.

In further embodiments, the patterned substrate 400 may include a barrier layer 410 that can limit the diffusion or interaction of fill material with the underlying substrate. In embodiments, the barrier layer 410 may include one or more of a refractory metal, a metal oxide, or a metal nitride, among other barrier layer materials. In additional embodiments, the barrier layer 410 may include one or more of tantalum, titanium, or tantalum nitride. In yet additional embodiments, the barrier layer 410 may facilitate deposition of a seed layer 415 and may also be or include an adhesion layer to facilitate the formation of the seed layer.

Embodiments of method 300 also include forming a seed layer 415 at operation 310. In embodiments, the seed layer 415 may be deposited at a uniform rate on all the interior surfaces of the opening 404, including the bottom surface 406 and the sidewall surfaces 408. In still further embodiments, the seed layer 415 may be a conformal layer that has the same thickness on both the bottom surface 406 and the sidewall surfaces 408. In embodiments, the seed layer 415 may be formed by physical vapor deposition or atomic layer deposition, among other deposition techniques. In additional embodiments, the seed layer 415 may include the same materials that are plated into the opening 404. In further embodiments, the seed layer 415 may include NTCu.

In additional embodiments, the seed layer 415 may be formed to a thickness of less than or about 100 nm, less than or about 50 nm, less than or about 25 nm, less than or about 10 nm, less than or about 5 nm, or less. In further embodiments, the formation of the seed layer 415 may provide coverage along certain regions of the opening 404, such as the bottom corners or sidewall surfaces 408 proximate the bottom surface 406 of the opening. In further embodiments, the seed layer 415 is thin enough to avoid pinching-off at the top of the opening that can hinder or prevent the electrodeposition of the NTCu-containing material into the opening by slowing or barring the NTCu-containing electrochemical plating fluid from reaching the bottom of the opening 404. It is to be understood that the structural characteristics of the opening 404, including the pitch size aspect ratio of the opening among other structural characteristics, is not intended to be limiting, and any of a variety of other patterned substrates 400, including seed layer materials, are similarly encompassed. Other exemplary patterned substrates may include two-dimensional and three-dimensional patterned substrates common in semiconductor manufacturing, and within which an opening or other feature may be formed, and along which a seed layer may be deposited. Additionally, although a patterned substrate that includes high-aspect-ratio openings may benefit from the present technology, the technology may be equally applicable to lower aspect ratio openings and other structures.

Embodiments of method 300 may further include removing one or more contaminants from the as-deposited seed layer 415 at operation 315. In additional embodiments, the one or more contaminants may include metal oxides that form on surfaces of the seed layer 415 that are exposed to oxygen in the aqueous electrochemical plating fluid or directly to air. In further embodiments, these metal oxides may include copper oxides, such as copper dioxide ($CuO_2$), that may be formed, at least in part, by the oxidation of copper metal in the seed layer 415. In more embodiments, the contaminants may be removed by contacting the as-deposited seed layer 415 with an etchant bath. In embodiments, the etchant bath may include an aqueous solution of an inorganic acid such as hydrochloric acid or sulfuric acid. In additional embodiments, the etchant bath may include a corrosion inhibitor, such as benzotriazole. In further embodiments, the contaminants may be removed by a plasma, such as an oxygen-containing etch plasma to remove organic materials, an argon- and/or nitrogen-containing plasma to expose a pristine surface, or a hydrogen-containing plasma to reduce surface oxides on the metal-containing surface, among other kinds of plasmas.

Some embodiments of method 300 may further optionally include forming a barrier layer 418 on the sidewall surfaces 408 of the opening 404 at operation 320. In embodiments, a precursor to the barrier layer 418 may be formed on all the exposed surfaces of the opening 404, including the bottom surface 406 and sidewall surfaces 408. Then a portion of the precursor to the barrier layer in contact with the bottom surface 406 may be removed to form the barrier layer 418 along the sidewall surfaces 408. In additional embodiments, the precursor to the barrier layer may be formed by atomic layer deposition of the barrier material. In still additional embodiments, the barrier material may include an inorganic dielectric material such as silicon oxide, silicon nitride, silicon-carbon-nitride, among other inorganic dielectric materials. In more embodiments, the barrier material may include a monolayer of an organic molecule. In still more embodiments, the monolayer of an organic molecule may include a self-assembled monolayer. In yet more embodiments, the self-assembled monolayer may include at least one of an alkylsilane compound or an alkylthiol compound. The barrier material may be formed on the bottom and sidewall surfaces of the opening 404 to a thickness that is less than or about 20 nm, less than or about 10 nm, less than or about 5 nm, less than or about 1 nm, or less. In yet more embodiments, the portion of the barrier material in contact with the bottom surface 406 of the opening may be removed by plasma etching or reactive ion etching, among other kinds of etching.

In embodiments, the barrier layer 418 slows or prevents the plating of copper on the sidewall surfaces 408 of the opening 404. This permits the plating of the NTCu from the bottom surface 406 of the opening 404 with little or no contact from polycrystalline copper growing from the sidewall surfaces 408. The barrier layer 418 facilitates a bottom-up plating of the NTCu in the opening 404 to the top of the opening. In further embodiments, the barrier layer 418 may reduce the rate of plating of copper on the sidewall surfaces 408 relative to the bottom surface 406 by greater than or about 50%, greater than or about 60%, greater than or about 70%, greater than or about 80%, greater than or about 90%, greater than or about 99%, or more. In still further embodiments, the barrier layer 418 prevents the plating of copper on the sidewall surfaces 408 of the opening 404 (i.e., a 100% reduction in the plating rate of copper on the sidewall surfaces relative to the bottom surface).

Figure 4B:
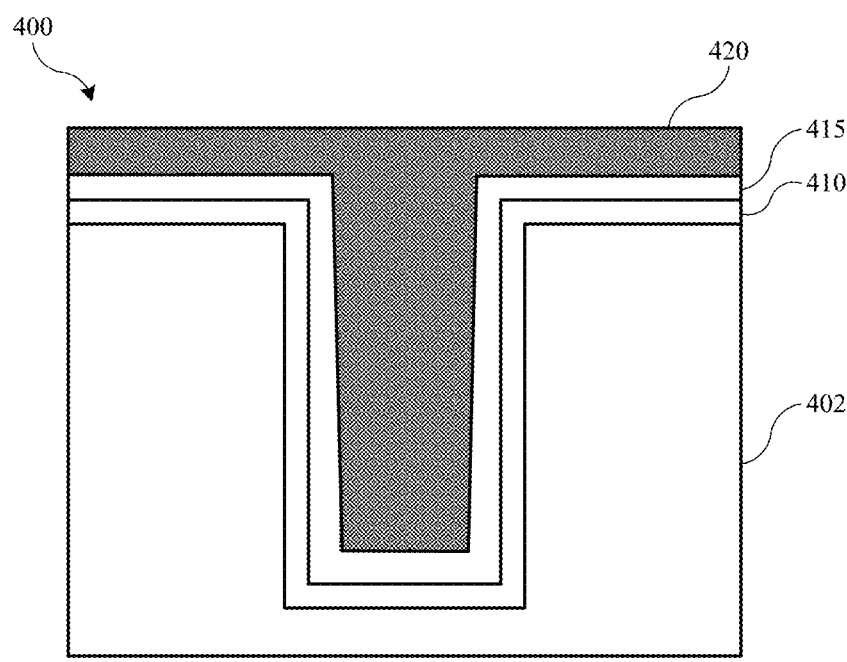

Embodiments of method 300 may yet also include plating an NTCu-containing material 420 into at least one opening 404 of a patterned substrate 400 at operation 325, as shown in FIG. 4B. In embodiments, the plating operation 325 may include the pulsed delivery of forward and reverse currents to the patterned substrate that plate and de-plate copper from the surfaces of the substrate. The reverse current de-plates the copper from the sidewall surfaces 408 faster than the bottom surface 406 of the opening 404. Successive cycles of forward and reverse current plate more NTCu-containing material on the bottom surface 406 than polycrystalline copper on the sidewall surfaces 408. When the fill has reached the top of the opening 404 a majority of the copper on the contact surface of the fill has a nanotwin crystal orientation. In further embodiments, the contact surface includes NTCu across greater than or about 50% of the surface area, greater than or about 55% of the surface area, greater than or about 60% of the surface area, greater than or about 65% of the surface area, greater than or about 70% of the surface area, greater than or about 75% of the surface area, greater than or about 80% of the surface area, greater than or about 85% of the surface area, greater than or about 90% of the surface area, or more.

In embodiments, the forward current is supplied to the patterned substrate 400 in contact with the electrochemical plating fluid in the electroplating chamber with a pulsing DC power supply. In additional embodiments, the pulse of forward current may be characterized by a duty cycle of less than or about 50%, less than or about 45%, less than or about 40%, less than or about 35%, less than or about 30%, less than or about 25%, less than or about 20%, or less. In further embodiments, the on-time of the duty cycle may be greater than or about 0.01 seconds, greater than or about 0.025 seconds, greater than or about 0.05 seconds, greater than or about 0.1 seconds, greater than or about 0.25 seconds, greater than or about 0.5 seconds, greater than or about 1 second, greater than or about 1.5 seconds, greater than or about 2 seconds, greater than or about 2.5 seconds, greater than or about 3 seconds, greater than or about 3.5 seconds, greater than or about 4 seconds, greater than or about 4.5 seconds, greater than or about 5 seconds, or more. In still further embodiments, the forward current may be characterized by an on-period of greater than or about 10 milliseconds, greater than or about 25 milliseconds, greater than or about 50 milliseconds, greater than or about 75 milliseconds, greater than or about 100 milliseconds, greater than or about 200 milliseconds, greater than or about 300 milliseconds, or more. In yet further embodiments, the forward current may be characterized by an average current density of less than or about 2.0 $mA/cm^2$, less than or about 1.5 $mA/cm^2$, less than or about 1.0 $mA/cm^2$, less than or about 0.5 $mA/cm^2$, or less. In more embodiments, the forward current may be characterized by a peak current during the on-time of greater than or about 0.5 A, and may be greater than or about 1.0 A, greater than or about 1.5 A, greater than or about 2.0 A, greater than or about 2.5 A, greater than or about 3.0 A, greater than or about 3.5 A, greater than or about 4.0 A, greater than or about 4.5 A, greater than or about 5.0 Å, or higher. In still more embodiments, the peak current may be characterized by a peak current density of greater than or about 2 $mA/cm^2$, and may be greater than or about 5 $mA/cm^2$, greater than or about 10 $mA/cm^2$, greater than or about 20 $mA/cm^2$, greater than or about 50 $mA/cm^2$, or higher.

In additional embodiments, the reverse current is delivered to the patterned substrate 400 following the delivery of the forward current. In embodiments, the reverse current may be delivered by the same pulsing DC power supply that delivers the forward current or by a different power supply. The reverse current de-plates a fraction of the copper plated on the patterned substrate 400 during the delivery of the forward current. In more embodiments, the reverse current de-plates less than or about 50 wt. % of the copper plated in the previous delivery of the forward current. In still more embodiments, the reverse current de-plates a fraction of the previously-plated copper that is less than or about 45 wt. %, less than or about 40 wt. %, less than or about 35 wt. %, less than or about 30 wt. %, less than or about 25 wt. %, less than or about 20 wt. %, less than or about 15 wt. %, less than or about 10 wt. %, less than or about 5 wt. %, or less. As noted above, the reverse current de-plates more plated copper from the sidewall surfaces 408 than the bottom surface 406 of opening 404. In embodiments, the difference in the amount of copper de-plated from the sidewall surfaces and bottom surface may be greater than or about 5%, greater than or about 10%, greater than or about 15%, greater than or about 20%, greater than or about 25%, greater than or about 30%, greater than or about 35%, greater than or about 40%, greater than or about 45%, greater than or about 50%, or more.

In some embodiments, the reverse current may be a pulsed current that has the same or similar average current density and peak current density as the forward current and a shorter period of on-time during its duty cycle. In additional embodiments, the reverse current may be a pulsed current with a lower average and peak current density than the forward current and the same or similar period of on-time during a comparable duty cycle. In further embodiments, the pulse of reverse current may be characterized by a duty cycle of less than or about 50%, less than or about 45%, less than or about 40%, less than or about 35%, less than or about 30%, less than or about 25%, less than or about 20%, or less. In further embodiments, the on-time of the duty cycle may be less than or about 100 milliseconds, less than or about 90 milliseconds, less than or about 80 milliseconds, less than or about 70 milliseconds, less than or about 60 milliseconds, less than or about 50 milliseconds, less than or about 40 milliseconds, less than or about 30 milliseconds, less than or about 20 milliseconds, less than or about 10 milliseconds, or less. In still further embodiments, the reverse current may be characterized by an average current density of less than or about 2.0 $mA/cm^2$, less than or about 1.5 $mA/cm^2$, less than or about 1.0 $mA/cm^2$, less than or about 0.5 $mA/cm^2$, or lower. In still more embodiments, the reverse current may be characterized by a peak current density of greater than or about 2 mA/cm$^2$, and may be greater than or about 5 mA/cm$^2$, greater than or about 10 mA/cm$^2$, greater than or about 20 mA/cm$^2$, greater than or about 50 mA/cm$^2$, or higher.

In more embodiments, the number of cycles of forward and reverse current being delivered to the patterned substrate 400 in contact with the electrochemical plating fluid in the electroplating chamber depends on the net NTCu plated after each cycle and the total amount of copper-containing material to fill the opening 404. In embodiments, the number of cycles may be greater than or about 1 cycle, greater than or about 2 cycles, greater than or about 3 cycles, greater than or about 4 cycles, greater than or about 5 cycles, greater than or about 6 cycles, greater than or about 7 cycles, greater than or about 8 cycles, greater than or about 9 cycles, greater than or about 10 cycles, greater than or about 15 cycles, greater than or about 20 cycles, or more. In still more embodiments, the overall plating rate of the NTCu-containing material may be characterized by a deposition rate of greater than or about 0.1 µm/minute, greater than or about 0.2 µm/minute, greater than or about 0.3 µm/minute, greater than or about 0.4 µm/minute, greater than or about 0.5 µm/minute, greater than or about 0.6 µm/minute, greater than or about 0.7 µm/minute, greater than or about 0.8 µm/minute, greater than or about 0.9 µm/minute, greater than or about 1 µm/minute, or more.

In embodiments, plating operation 325 may include a first period of time where the plated copper-containing material may include less or no NTCu and a second period of time where the plated copper-containing material includes a greater portion of NTCu. The copper plated in the first period of time may be characterized by a fast deposition that fills a lower portion of the opening 404 with mostly polycrystalline copper. This permits the NTCu copper plated during the second period to be deposited in a partially-filled opening that has a lower aspect ratio and less sidewall surface area relative to the bottom surface area compared to the unfilled opening. There is less interference from polycrystalline copper growing from the sidewall surfaces when plating the NTCu-containing material on the bottom surface of the partially-filled opening. The total plating times may also be shorter due to the faster plating rates of the polycrystalline copper-containing material during the first period of the plating operation.

In additional embodiments, the first period of time for the plating operation 325 may be characterized by a first deposition rate for the copper-containing material on the patterned substrate 404 that is greater than or about 10% faster than a second deposition rate for the NTCu-containing material during the second period of time. In still additional embodiments, the percentage difference in the first and second deposition rates may be greater than or about 15%, greater than or about 20%, greater than or about 25%, greater than or about 30%, greater than or about 35%, greater than or about 40%, greater than or about 45%, greater than or about 50%, or more. In more embodiments, the first period of time may be greater than or about 1 minute, greater than or about 2 minutes, greater than or about 5 minutes, greater than or about 10 minutes, or more. In yet more embodiments, the plating rate of the copper-containing material during the first period may be characterized by a deposition rate of greater than or about 0.5 µm/minute, greater than or about 0.75 µm/minute, greater than or about 1 µm/minute, greater than or about 1.25 µm/minute, greater than or about 1.5 µm/minute, or higher. In still additional embodiments, the first period of time may last until the partially-filled opening reaches an aspect ratio of less than or about 2:1, less than or about 1.5:1, less than or about 1:1, less than or about 0.5:1, or less. In yet further embodiments, the plating operation during the first period of time may include delivering a continuous forward current to the patterned substrate 400 from a DC power supply. In still additional embodiments, the plated copper-containing material in the bottom portion of the opening may include less than or about 25 wt. % NTCu, less than or about 20 wt. % NTCu, less than or about 15 wt. % NTCu, less than or about 10 wt. % NTCu, less than or about 5 wt. % NTCu, less than or about 1 wt. % NTCu, or less.

In further embodiments, the second period of time for the plating operation 325 may be characterized by a second deposition rate for the NTCu-containing material that is less than or about 1 µm/minute, less than or about 0.9 µm/minute, less than or about 0.8 µm/minute, less than or about 0.7 µm/minute, less than or about 0.6 µm/minute, less than or about 0.5 µm/minute, or less. In still further embodiments, the plating operation during the second period of time may include one or more cycles of forward/reverse current delivery to the patterned substrate or delivery of pulsed forward current without a reverse current component. In yet additional embodiments, the plated copper-containing material in the top portion of the opening may include greater than or about 50 wt. % NTCu, greater than or about 55 wt. % NTCu, greater than or about 60 wt. % NTCu, greater than or about 65 wt. % NTCu, greater than or about 70 wt. % NTCu, greater than or about 75 wt. % NTCu, greater than or about 80 wt. % NTCu, greater than or about 85 wt. % NTCu, greater than or about 90 wt. % NTCu, or more.

In embodiments, the electrochemical plating fluid in contact with the patterned substrate 400 during the plating operation may be an aqueous solution that includes copper ions. In further embodiments, the concentration of copper ions may be greater than or about 0.1 M, greater than or about 0.2 M, greater than or about 0.3 M, greater than or about 0.4 M, greater than or about 0.5 M, greater than or about 0.6 M, greater than or about 0.7 M, greater than or about 0.7 M, greater than or about 0.9 M, greater than or about 1 M, or more. In more embodiments, the copper ions may be supplied by water-soluble copper-containing salts such as copper sulfate and copper chloride, among other copper-containing salts. In additional embodiments, the electrochemical plating fluid may be characterized as acidic with a pH of less than or about 7, less than or about 6, less than or about 5, less than or about 4, less than or about 3, less than or about 2, less than or about 1, or less. In yet additional embodiments, the pH of the electrochemical plating fluid may be adjusted by an acid such as sulfuric acid or hydrochloric acid, among other acids. In still further embodiments, the electrochemical plating fluid may include one or more additional compounds to facilitate the plating of the NTCu-containing material, such as one or more thickening agents, one or more surfactants, one or more accelerators, one or more levelers, one or more suppressors, and one or more polarizers, among other compounds.

Some embodiments of method 300 may yet further optionally include annealing the plated NTCu-containing material at operation 330. In some embodiments, the annealing operation further stabilizes the NTCu to slow or prevent its conversion into polycrystalline copper. In further embodiments, the annealing operation converts at least some of the polycrystalline copper in the opening into additional NTCu copper. In embodiments, the annealing temperature may be less than or about 175° C., less than or about 170° C., less than or about 165° C., less than or about 160° C., less than or about 155° C., less than or about 150° C., less than or about 145° C., less than or about 140° C., or lower. In further embodiments, the annealing time may be less than or about 5 hours, less than or about 4 hours, less than or about 3 hours, less than or about 2 hours, less than or about 1 hour, or less. In still further embodiments, the annealing operation may occur in an oxygen-free atmosphere.

Embodiments of the present technology provide nanotwin-phased copper (NTCu) for a variety of integrated circuit structures, including high-density interconnect lines, vias, and pillars, among other kinds of IC structures. The embodiments address the problems of polycrystalline copper, growing from the sidewall surfaces of an opening, interfering with the deposition of NTCu from the bottom surface of the opening. The embodiments include a number of strategies to hinder or prevent the growth of polycrystalline copper from the sidewall surfaces of an opening, including the formation of a barrier layer on the sidewall surfaces, the pulsed forward/reverse current plating cycles that favor bottom-up plating over sidewall plating, and the partial fill to decrease an opening's aspect ratio for a NTCu plating operation. Embodiments of the present technology also include post-plating anneal operations to stabilize and further grow the percentage of NTCu in the copper-containing fill material. The contact surfaces of the fill material are characterized by a high percentage of NTCu that lowers the temperatures and pressures required for copper-copper bonding of adjacent ends of a wire, interconnect, pad, or other copper-containing integrated circuit component.

Embodiments of the present technology address the problems with bonding polycrystalline copper in high-interconnect-density integrated circuit devices by replacing the polycrystalline copper with nanotwin copper (NTCu), which has a <1,1,1> crystallographic orientation. In additional embodiments, a significant percentage of the NTCu grains at a bonding surface of the metal are oriented in the same <1,1,1> direction. NTCu is significantly less prone to oxidation and the formation of copper oxide than polycrystalline copper. NTCu is also characterized by diffusivity rates that are normally x$10^3$ to x$10^4$ higher than polycrystalline copper. Due to these and other characteristics, bonding temperatures and pressures for NTCu are significantly lower than polycrystalline copper. Unfortunately, NTCu is not as stable as other crystal phases of copper, and it has proven challenging to electroplate the openings in patterned substrates with NTCu that does not destabilize to form one or more kinds of polycrystalline copper.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the period of time" includes reference to one or more periods of time and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating method comprising:
    contacting a patterned substrate with a plating bath in an electroplating chamber, wherein the pattern substrate comprises at least one opening having a bottom surface and one or more sidewall surfaces; and
    forming a metal material in the at least one opening, wherein the metal material is formed by two or more cycles comprising:
        delivering a forward current from a power supply through the plating bath of the electroplating chamber for a first period of time, wherein the forward current is a pulsed current characterized by a duty cycle of less than or about 50%;
        plating a first amount of the metal on the bottom surface of the opening on the patterned substrate and a second amount of the metal on the sidewall surfaces of the opening, wherein at least a portion of the first amount of the metal is characterized by a nanotwin crystal structure; and
        delivering a reverse current from the power supply through the plating bath of the electroplating chamber to remove some of the metal plated in the opening on the patterned substrate, wherein the reverse current removes a greater portion of the second amount of the metal plated on the sidewall surfaces of the opening than the first amount of the metal plated on the bottom surface.

2. The electroplating method of claim 1, wherein the metal material formed in the at least one opening comprises nanotwin copper.

3. The electroplating method of claim 1, wherein the method further comprises annealing the metal material formed in the at least one opening to increase the amount of the metal characterized by the nanotwin crystal structure.

4. The electroplating method of claim 1, wherein the sidewall surfaces further comprise a barrier layer that reduces a deposition rate of the second amount of the metal plated on the sidewall surfaces.

5. An electroplating method comprising:
- providing a patterned substrate comprising at least one opening having a bottom surface and one or more sidewall surfaces;
- forming a barrier layer on the bottom surface and sidewall surfaces of the opening;
- removing the barrier layer from the bottom surface of the opening, wherein the barrier layer remains on the sidewall surfaces; and
- plating a metal in the opening, wherein the plating includes one or more cycles comprising plating a first amount of a metal on the bottom surface of the opening at a first deposition rate and a second amount of the metal on the sidewall surfaces at a second deposition rate that is less than or about 0.5 times as fast as the first deposition rate, and wherein at least a portion of the first amount of the metal is characterized by a nanotwin crystal structure.

6. The electroplating method of claim 5, wherein the barrier layer comprises a non-metal dielectric material.

7. The electroplating method of claim 5, wherein the first amount of the metal formed on the bottom surface of the opening comprises nanotwin copper.

8. The electroplating method of claim 5, wherein each of the cycles of the plating of the metal comprises:
- delivering a forward current from a power supply through a plating bath of an electroplating chamber for a first period of time to plate the first amount of the metal on the bottom surface of the opening and the second amount of the metal on the sidewall surfaces of the opening, and
- delivering a reverse current from the power supply through the plating bath of the electroplating chamber to remove some of the metal plated in the opening on the patterned substrate, wherein the reverse current removes a greater portion of the second amount of the metal plated on the sidewall surfaces of the opening than the first amount of the metal plated on the bottom surface.

9. The electroplating method of claim 1, wherein the forward current is characterized by an on period of greater than or about 10 milliseconds.

10. The electroplating method of claim 1, wherein the forward current is characterized by an average current density of greater than or about 3 $mA/cm^2$.

11. The electroplating method of claim 1, wherein the reverse current is another pulsed current characterized by an on period of less than or about 10 milliseconds.

12. The electroplating method of claim 1, wherein the reverse current is delivered at least 1 millisecond after the pulsed forward current.

13. The electroplating method of claim 5, wherein the method further comprises removing at least a portion of one or more metal oxides from the metal plated in the opening of the patterned substrate.

14. The electroplating method of claim 5, wherein the method further comprises annealing the metal plated in the opening to increase the amount of the metal characterized by the nanotwin crystal structure.

15. The electroplating method of claim 5, wherein the barrier layer comprises a monolayer of an organic molecule.

16. The electroplating method of claim 5, wherein the opening is characterized by an aspect ratio greater than or about 1:1.

17. The electroplating method of claim 5, wherein a bottom portion of the metal in contact with the bottom surface of the opening is characterized by a polycrystalline structure.

\* \* \* \* \*